United States Patent

Mochizuki

(10) Patent No.: US 9,182,272 B2
(45) Date of Patent: Nov. 10, 2015

(54) LASER MODULE

(71) Applicant: Keita Mochizuki, Tokyo (JP)

(72) Inventor: Keita Mochizuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 297 days.

(21) Appl. No.: 13/775,357

(22) Filed: Feb. 25, 2013

(65) Prior Publication Data

US 2013/0256516 A1    Oct. 3, 2013

(30) Foreign Application Priority Data

Mar. 29, 2012   (JP) .................................. 2012-078342

(51) Int. Cl.

| | | |
|---|---|---|
| *G01J 1/02* | (2006.01) | |
| *G01J 1/04* | (2006.01) | |
| *H01S 5/02* | (2006.01) | |
| *H01S 3/02* | (2006.01) | |
| *G01J 1/42* | (2006.01) | |
| *H01S 5/0683* | (2006.01) | |

(Continued)

(52) U.S. Cl.
CPC .............. *G01J 1/0204* (2013.01); *G01J 1/0488* (2013.01); *G01J 1/4257* (2013.01); *H01S 3/025* (2013.01); *H01S 5/02* (2013.01); *H01S 5/0683* (2013.01); *H01S 5/4087* (2013.01); *G01J 9/0246* (2013.01); *H01S 5/005* (2013.01); *H01S 5/0617* (2013.01); *H01S 5/0687* (2013.01); *H01S 5/4012* (2013.01)

(58) Field of Classification Search
CPC .............. H01S 3/02; H01S 3/025; H01S 5/02
USPC .......... 250/226, 552, 553; 372/50.12, 50.121, 372/50.122
See application file for complete search history.

(56) References Cited

U.S. PATENT DOCUMENTS

| | | |
|---|---|---|
| 5,343,548 A | 8/1994 | Hall et al. |
| 6,678,432 B2 | 1/2004 | Shigeta et al. |

(Continued)

FOREIGN PATENT DOCUMENTS

| | | |
|---|---|---|
| CN | 1165952 A | 11/1997 |
| JP | 11-274650 | 10/1999 |

(Continued)

OTHER PUBLICATIONS

Combined Chinese Office Action and Search Report issued Feb. 11, 2015 in Patent Application No. 201310103340.2 (with partial English language translation and English translation of categories of cited documents).

(Continued)

*Primary Examiner* — Kevin Pyo
(74) *Attorney, Agent, or Firm* — Oblon, McClelland, Maier & Neustadt, L.L.P.

(57) ABSTRACT

To make miniaturization of a laser module easier. In the laser block of a laser module, multiple semiconductor laser elements that each emit a beam of laser light are disposed. A collimating lens receives and collimates the individual beams of laser light emitted from the laser block, and emits collimated light. Photodiodes detect the individual beams of collimated light emitted from the collimating lens, and output signals corresponding to the intensities of the individual beams of collimated light. Additionally, the photodiodes are disposed on the propagation paths of collimated light emitted from the collimating lens, and in addition, are disposed at positions that receive a portion of collimated light for all the individual beams of collimated light which are emitted.

10 Claims, 15 Drawing Sheets

(51) Int. Cl.
  *G01J 9/02* (2006.01)
  *H01S 5/0687* (2006.01)
  *H01S 5/00* (2006.01)
  *H01S 5/06* (2006.01)
  *H01S 5/40* (2006.01)

(56) References Cited

U.S. PATENT DOCUMENTS

| | | | |
|---|---|---|---|
| 6,915,035 | B2 | 7/2005 | Iwafuji |
| 8,953,164 | B2 * | 2/2015 | Mochizuki et al. ............ 356/416 |
| 2003/0039276 | A1 * | 2/2003 | Tatsuno et al. .................. 372/31 |
| 2012/0147361 | A1 | 6/2012 | Mochizuki et al. |

FOREIGN PATENT DOCUMENTS

| | | |
|---|---|---|
| JP | 2002-171023 | 6/2002 |
| JP | 2002-185074 | 6/2002 |
| JP | 2003-218446 | 7/2003 |
| JP | 2004-207420 | 7/2004 |
| JP | 2009-141107 | 6/2009 |
| JP | 2010-122473 | 6/2010 |
| JP | 2012-129259 | 7/2012 |

OTHER PUBLICATIONS

Office Action issued Aug. 18, 2015 in Japanese Patent Application No. 2012-078342 (with Partial English-language Translation).

* cited by examiner

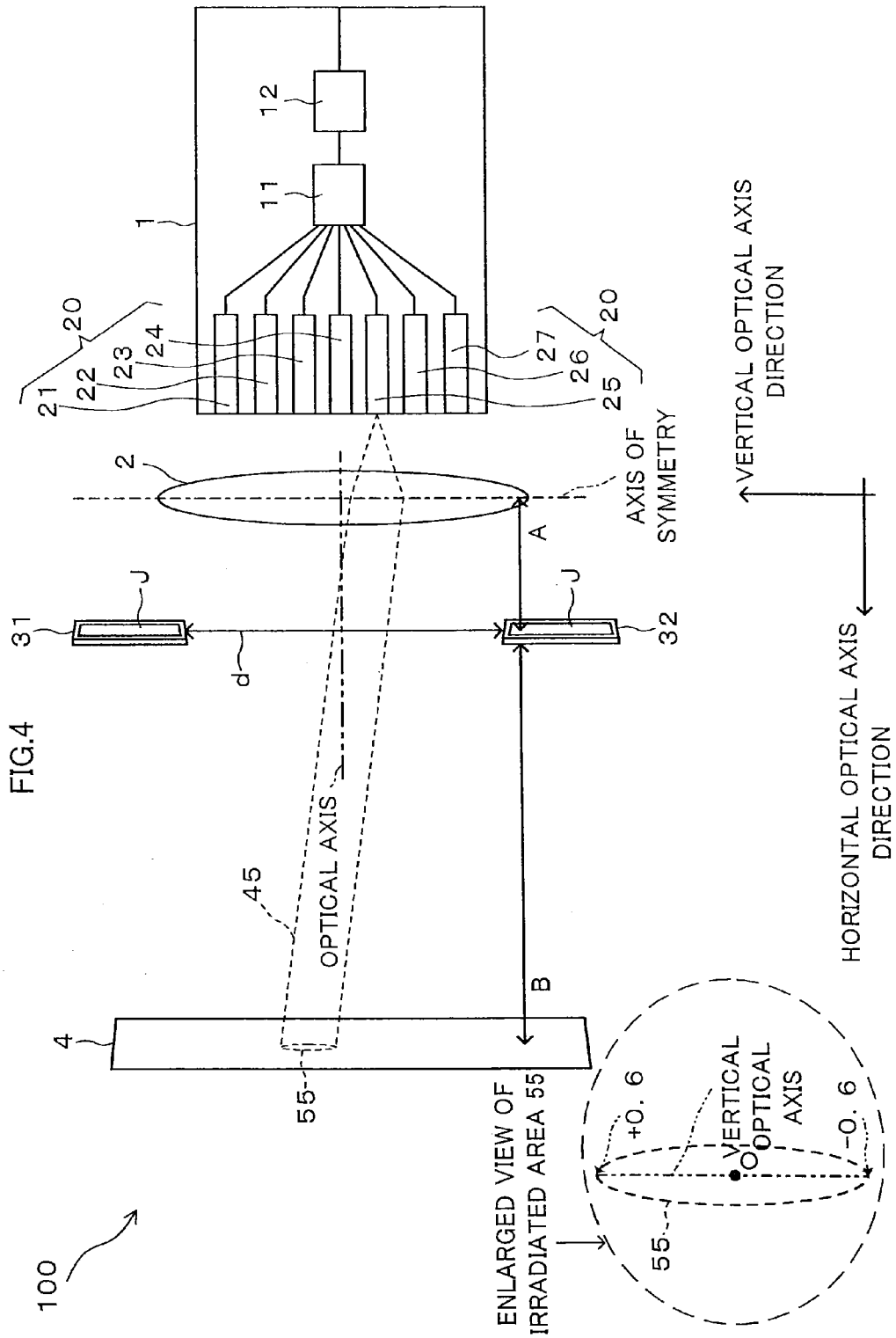

LASER MODULE

CROSS-REFERENCE TO RELATED APPLICATION

This application claims the benefit of Japanese Patent Application No. 2012-78342, filed on Mar. 29, 2012, the entire disclosure of which is incorporated by reference herein.

FIELD

This application relates to a laser module.

BACKGROUND

Unexamined Japanese Patent Application Kokai Publication No. 2002-171023 (Patent Literature 1) describes a package (laser module) that enables computation of the variation in the intensity and wavelength of emitted laser light.

The package is equipped with multiple semiconductor lasers (laser diodes) having different wavelengths of emitted laser light. Light is emitted from each semiconductor laser, and after passing through a collimating lens, rear light is split into a forward direction and a 90° reflected direction by a beam splitter. The package, using a photodetector, then enables measurement of the intensity of the split light by sensing the light split into the 90° reflected direction. Thus, the package enables computation of the intensity of laser light emitted from the semiconductor lasers on the basis of the measured intensity of the split light.

Furthermore, in the package (laser module) described in Patent Literature 1, the light in the forward direction that was split by the beam splitter is sensed with a photodetector after being transmitted through an etalon filter having a wavelength-dependent transmittance, thus enabling measurement of the intensity of the transmitted light transmitted through the etalon filter. Thus, the package enables computation of the variation in the wavelength of laser light emitted from the semiconductor lasers. Specifically, the package computes the transmission coefficient, being the ratio of the measured intensity for the transmitted light transmitted through the etalon filter versus the measured intensity of the light that was split into the 90° reflected direction. By comparing the computed transmission coefficient to the transmittance unique to (characteristic of) the etalon filter, the package enables computation of the variation in the wavelength of the laser light emitted from the semiconductor lasers.

In this way, the package (laser module) described in Patent Literature 1 enables computation of the variation in the intensity and wavelength of laser light emitted from semiconductor lasers by causing the rear light to be emitted from semiconductor lasers, transmitted through a collimating lens, and split with a beam splitter.

As described above, the package described in Patent Literature 1 includes a beam splitter that splits light in order to compute the variation in the intensity and wavelength of laser light emitted from semiconductor lasers. Since the beam splitter needs to split all laser light of differing wavelengths emitted from the semiconductor lasers, the beam splitter is larger in scale compared to the semiconductor lasers and the photodetectors. Consequently, there has been a problem in that the package (laser module) described in Patent Literature 1 is difficult to miniaturize.

SUMMARY

Being devised in light of the above circumstances, the present invention has an objective to provide a laser module that is easy to miniaturize.

In order to achieve the above object, multiple laser elements that emit laser light are disposed in the laser block of a laser module according to the invention. A collimating lens receives the individual beams of laser light emitted from the laser block, and collimates the laser light to emit collimated light. Output devices detect the individual beams of collimated light emitted from the collimating lens, and output signals corresponding to the intensities of the individual beams of collimated light. Furthermore, the output devices lie in the path of propagation for the collimated light emitted from the collimating lens, and in addition, are disposed at positions that receive a portion of collimated light for all individual beams of collimated light which are emitted.

According to the present invention, a beam splitter is unnecessary, and thus miniaturization is easier compared to a laser module that uses a beam splitter.

BRIEF DESCRIPTION OF THE DRAWINGS

A more complete understanding of this application can be obtained when the following detailed description is considered in conjunction with the following drawings, in which:

FIG. 4 is a configuration diagram of a laser module in a simulation;

DETAILED DESCRIPTION

Embodiment 1

Figure 1:
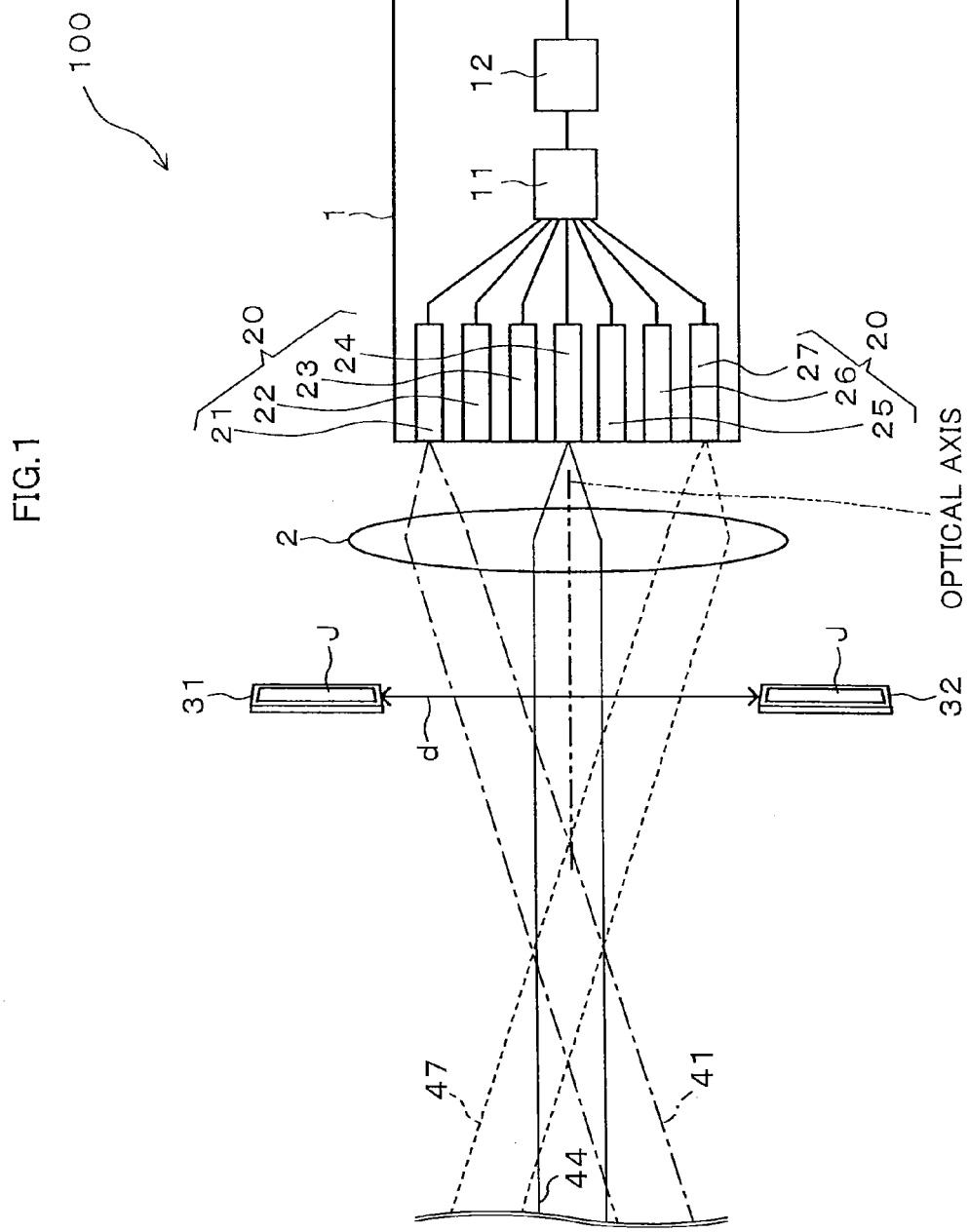
FIG. 1 is a configuration diagram of a laser module according to Embodiment 1 of the present invention.

Hereinafter, a laser module 100 according to Embodiment 1 of the present invention will be described with reference to FIG. 1 to 5D.

The laser module 100 enables computation of the intensity of laser light by detecting a portion of laser light from all beams of laser light. Thus, since a beam splitter is unnecessary, the laser module 100 is easier to miniaturize compared to a laser module that uses a beam splitter.

The laser module 100 is equipped with a semiconductor substrate 1, a collimating lens 2, and photodiodes 31 and 32.

The semiconductor substrate 1 is equipped with a laser block 20, an optical multiplexer 11, an optical amplifier 12, and optical waveguides connecting therebetween. Note that features such as traces and electrode pads formed on the semiconductor substrate 1 are omitted from illustration.

The laser block 20 includes seven semiconductor laser elements 21 to 27. The semiconductor laser elements 21 to 27 are laser diodes that emit laser light with respectively different wavelengths. When a predefined voltage is applied, the semiconductor laser elements 21 to 27 respectively emit laser light from respective emission points located on each element's short edge. Specifically, each of the semiconductor laser elements 21 to 27 emits laser light in the direction of the collimating lens 2 and in the direction of the optical multiplexer 11 (in two directions). The emission points on the optical multiplexer 11 side of the semiconductor laser elements 21 to 27 are connected to the optical multiplexer 11 via optical waveguides.

The emission points on the collimating lens 2 side of the semiconductor laser elements 21 to 27 are disposed at positions coinciding with the focal points of the collimating lens 2. Additionally, the emission points of the semiconductor laser element 21 and the semiconductor laser element 27 are disposed at positions 0.3 mm away, respectively, with the emission point of the semiconductor laser element 24 as a point of reference. Also, the emission points of the semiconductor laser element 22 and the semiconductor laser element 26 are disposed at positions 0.2 mm away, respectively, with the emission point of the semiconductor laser element 24 as a point of reference. Also, the emission points of the semiconductor laser element 23 and the semiconductor laser element 25 are disposed at positions 0.1 mm away, respectively, with the emission point of the semiconductor laser element 24 as a point of reference.

The optical multiplexer 11 mixes the beams of laser light emitted in the direction of the optical multiplexer 11 from the semiconductor laser elements 21 to 27, and outputs the mixed result to the optical amplifier 12. The input of the optical multiplexer 11 is connected to the emission points on the optical multiplexer 11 side of the semiconductor laser elements 21 to 27 via optical waveguides. The output of the optical multiplexer 11 is connected to the optical amplifier 12 via an optical waveguide.

The optical amplifier 12 amplifies mixed laser light output from the optical multiplexer 11. The input of the optical amplifier 12 is connected to the output of the optical multiplexer 11 via an optical waveguide. The output of the optical amplifier 12 is connected to an optical waveguide. Laser light output from the optical amplifier 12 is output from the end of the semiconductor substrate 1 via the optical waveguide.

The collimating lens 2 receives individual beams of laser light, which are scattered light emitted from the emission points on the collimating lens 2 side of the semiconductor laser elements 21 to 27, and collimates the individual beams of laser light to emit collimated light. Specifically, the collimating lens 2 collimates the received laser light to emit collimated light with a Gaussian intensity distribution.

Among the collimated light beams, the collimated light that corresponds to the laser light emitted from the semiconductor laser element 21 propagates along a path 41, for example. Likewise, the collimated light that corresponds to the laser light emitted from the semiconductor laser element 24 propagates along a path 44. Likewise, the collimated light that corresponds to the laser light emitted from the semiconductor laser element 27 propagates along a path 47.

The path 41 and the path 47 are the outermost paths. In other words, the paths 42 to 46 not illustrated in the drawings lie between the path 41 and the path 47.

Figure 2:
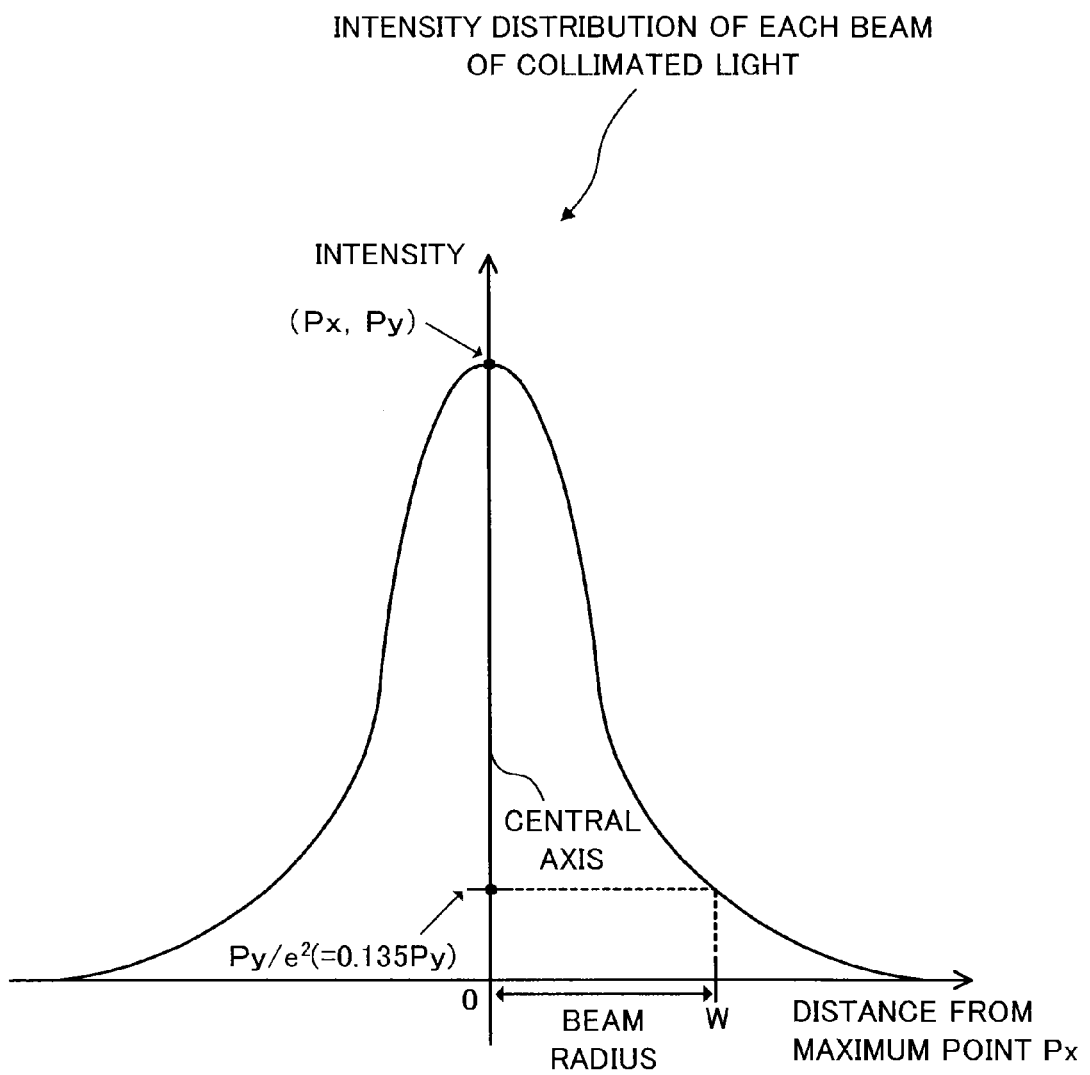
FIG. 2 is a diagram illustrating an intensity distribution of collimated light emitted from a collimating lens.

Herein, the intensity distribution of each beam of collimated light emitted from the collimating lens 2 is as illustrated in FIG. 2.

As discussed earlier, the intensity of each beam of collimated light emitted from the collimating lens 2 (the collimated light corresponding to the laser light emitted from the respective semiconductor laser elements 21 to 27) expresses a Gaussian distribution. In a Gaussian distribution, when the x coordinate indicated by Px is zero, the y coordinate indicated by Py expresses the maximum intensity. Also, in a Gaussian distribution, the intensity attenuates as Px becomes more distant from zero. Herein, the beam radius w of the collimated light is the shortest distance from the position (coordinate) on the Gaussian distribution where the intensity is $1/e^2$ times the maximum intensity indicated by Py (0.135× Py) to the central axis of the collimated light. Note that the central axis of the collimated light refers to the line on the y axis where the collimated light intensity becomes the maximum intensity Py. In other words, the central axis of the collimated light refers to the axis of symmetry for the Gaussian distribution.

The photodiodes 31 and 32 illustrated in FIG. 1 detect a portion of the collimated light emitted by the collimating lens 2 on square photodetector areas J which are 300 μm long on one edge, and output signals (currents) corresponding to the detected collimated light intensity. Specifically, the currents which are output by the photodiodes 31 and 32 increase as the intensity of the portion of collimated light detected by the photodetector areas J increases, whereas the currents which are output decrease as the intensity of the portion of collimated light detected by the photodetector areas J decreases. Note that hereinafter, the currents output by the photodiodes 31 and 32 will be designated the photodetector currents.

With the photodetector currents respectively output from the photodiodes 31 and 32, it is possible to compute the intensity of each beam of collimated light. Specifically, a measuring instrument (such as a personal computer; not illustrated), which combines the photodetector currents respectively output from the photodiodes 31 and 32 to measure the sum of photodetector current values, is made to store a table associating collimated light intensities with sums of photodetector current values. Thus, the measuring instrument is able to compute the intensity of each beam of collimated light from the sum of photodetector current values from the photodiodes 31 and 32. This functionality is enabled by the laser module 100.

The respective photodetector areas J of the photodiodes 31 and 32 are disposed facing the direction of the collimating lens 2 on a line which is parallel to the layout direction of the semiconductor laser elements 21 to 27 and which orthogonally intersects the optical axis of the collimating lens 2. Thus, the respective photodetector areas J of the photodiodes 31 and 32 are disposed along the propagation paths 41 to 47 of collimated light emitted from the collimating lens 2 (at positions such that all the collimated light paths 41 to 47 lie between the photodetector areas J). Also, the respective photodetector areas J of the photodiodes 31 and 32 are disposed at equally spaced intervals from each other with the optical axis of the collimating lens 2 as the midpoint.

By being disposed in this way, the photodiodes 31 and 32 may be disposed at positions distanced from the central axis of the individual beams of collimated light. Thus, the respective photodetector areas J of the photodiodes 31 and 32 are able to detect a portion of collimated light for all individual beams of collimated light emitted from the collimating lens 2.

Figure 3:
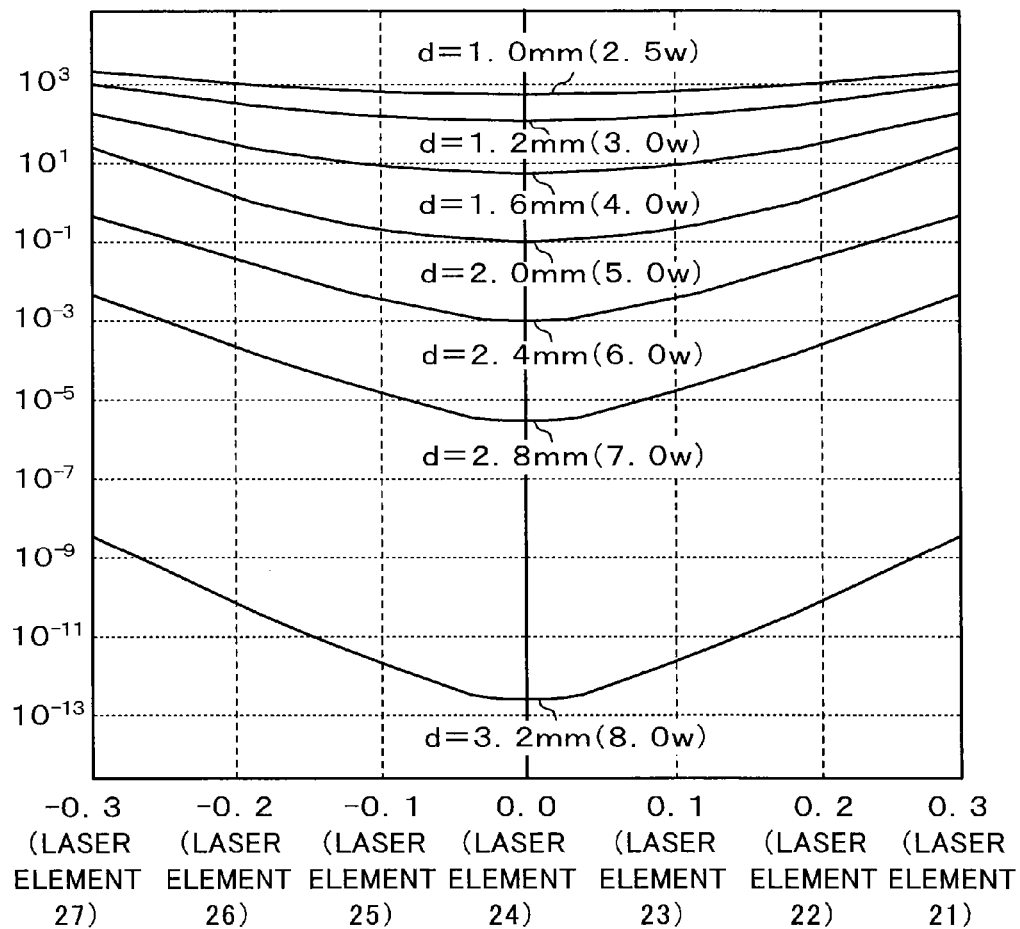
FIG. 3 is a diagram illustrating simulation results for sums of photodetector current values.

Relationships between the spacing of the respective photodetector areas J of the photodiodes 31 and 32 and the sum of photodetector current values from the photodiodes 31 and 32 are as illustrated in FIG. 3.

In FIG. 3, the vertical axis of the graph represents the sum of the values of the photodetector current output by the photodiode 31 and the photodetector current output by the photodiode 32 (the sum of the photodetector current values). The horizontal axis of the graph represents the distances from the central axes of individual beams of collimated light emitted from the collimating lens 2 (corresponding to the individual beams of laser light emitted from the semiconductor laser elements 21 to 27) to the optical axis of the collimating lens 2 on the line joining the photodiode 31 and the photodiode 32. Note that on the horizontal axis, negative numbers are used to express distances to the optical axis of the collimating lens 2 from the central axes of individual beams of collimated light emitted from the collimating lens 2 after being emitted from the semiconductor laser elements 25 to 27. Also, on the horizontal axis, positive numbers are used to express distances to the optical axis of the collimating lens 2 from the central axes of individual beams of collimated light emitted from the collimating lens 2 after being emitted from the semiconductor laser elements 21 to 23.

Additionally, FIG. 3 illustrates the case where the beam radius w of the individual beams of collimated light emitted from the collimating lens 2 is 0.4 mm, and the output power of each of the semiconductor laser elements 21 to 27 is 10 mW.

Furthermore, FIG. 3 illustrates simulation results for when the spacing d between the photodiodes 31 and 32 is set according to the following seven cases. Namely, respective simulation results are illustrated for when the spacing d between the photodiodes 31 and 32 is set to 2.5 times the beam radius w at 1.0 mm, 3.0 times the beam radius w at 1.2 mm, 4.0 times the beam radius w at 1.6 mm, 5.0 times the beam radius w at 2.0 mm, 6.0 times the beam radius w at 2.4 mm, 7.0 times the beam radius w at 2.8 mm, and 8.0 times the beam radius w at 3.2 mm.

As illustrated in FIG. 3, the sum of photodetector current values in the case of detecting a beam of collimated light corresponding to the laser light output from the semiconductor laser element 24 expresses a small value compared to the sum of photodetector current values in the case of detecting the other beams of collimated light, irrespective of the spacing d between the photodiodes 31 and 32.

This is because unlike the other beams of collimated light, the beam of collimated light corresponding to the laser light output from the semiconductor laser element 24 is farthest away from both of the photodetector areas J of the photodiodes 31 and 32, and is the most difficult to detect.

In addition, the sums of photodetector current values have an overall tendency to decrease as the spacing d between the photodiodes 31 and 32 increases. This is because the intensity of the partial collimated light detected by the respective photodetector areas J of the photodiodes 31 and 32 weakens as the spacing d between the photodiodes 31 and 32 increases.

In the case where the spacing d between the photodiodes 31 and 32 is 7.0 times the beam radius w (2.8 mm), the sum of photodetector current values has a maximum value of approximately $7 \times 10^{-3}$ µA, and a minimum value of approximately $3 \times 10^{-6}$ µA. In other words, the minimum value of the sum of photodetector current values is approximately 1/2300 the maximum value.

Furthermore, in the case where the spacing d between the photodiodes 31 and 32 is 8.0 times the beam radius w (3.2 mm), the sum of photodetector current values has a maximum value of approximately $8 \times 10^{-9}$ µA, and a minimum value of approximately $8 \times 10^{-13}$ µA. In other words, the minimum value of the sum of photodetector current values is approximately 1/10000 the maximum value.

Meanwhile, in the case where the spacing d between the photodiodes 31 and 32 is 6.0 times the beam radius w (2.4 mm), the sum of photodetector current values has a maximum value of approximately $7 \times 10^{-1}$ µA, and a minimum value of approximately $1 \times 10^{-3}$ µA. In other words, the minimum value of the sum of photodetector current values is approximately 1/700 the maximum value, keeping within 1/1000.

In this way, if the spacing d between the photodiodes 31 and 32 becomes equal to or greater than 7.0 times the beam radius w (2.8 mm), the intensity of the portion of collimated light detected at the photodetector areas J of the photodiodes 31 and 32 weakens (in other words, it becomes more difficult to detect a portion of collimated light), and the ratio of the minimum value of the sum of photodetector current values versus the maximum value starts to fall significantly below 1/1000.

At this point, if the minimum value of the sum of photodetector current values falls significantly below 1/1000 the maximum value, a measuring instrument with a large dynamic range becomes necessary. In other words, if the spacing d between the photodiodes 31 and 32 becomes equal to or greater than the 7.0 times the beam radius w (2.8 mm), measuring the minimum value of the sum of photodetector current values becomes difficult with anything other than a measuring instrument with a large dynamic range.

Furthermore, if the spacing d between the photodiodes 31 and 32 becomes equal to or greater than 7.0 times the beam radius w (2.8 mm), the current value falls below $1 \times 10^{-3}$ µA. In cases where the current value falls below $1 \times 10^{-3}$ µA, the measurement result for that current value typically will be buried in the thermal noise of the measuring instrument. From such a perspective, measuring the minimum value of the sum of photodetector current values likewise becomes difficult if the spacing d between the photodiodes 31 and 32 becomes equal to or greater than the 7.0 times the beam radius w (2.8 mm).

In other words, in the case where the spacing d between the photodiodes 31 and 32 becomes equal to or greater than 7.0 times the beam radius w (2.8 mm), measuring the sum of photodetector current values becomes difficult from the perspective of dynamic range and the perspective of current value measurement, and as a result, computing the intensity of each beam of collimated light becomes difficult.

However, in the case where the spacing d between the photodiodes 31 and 32 is set less than or equal to 6.0 times the beam radius w (2.4 mm), the intensity of the portion of collimated light detected by the respective photodetector areas J of the photodiodes 31 and 32 may be ensured, and thus the minimum value of the sum of photodetector current values may be kept within 1/1000 the maximum value. In addition, the minimum value of the photodetector current may be set to approximately $1 \times 10^3$ µA. Thus, setting the spacing d between the photodiodes 31 and 32 less than or equal to 6.0 times the beam radius w (2.4 mm) enables measurement of the sum of photodetector current values in the laser module 100, and as a result, enables computation of the intensity of each beam of collimated light.

Next, the question of how narrow the spacing d between the photodiodes 31 and 32 may be made will be described using FIG. 4 to 5D.

FIG. 4 illustrates a configuration for a simulation used in an investigation of how narrow the spacing d between the photodiodes 31 and 32 may be made.

In this simulation, results are obtained regarding how the distribution of electric field strength in an observation plane 4 for collimated light emitted from the collimating lens 2 and propagating along the path 45 (in other words, collimated light corresponding to the laser light emitted from the semiconductor laser element 25) varies in response to varying the spacing d between the photodiodes 31 and 32.

In the simulation herein, laser light emitted from the semiconductor laser element 25 is made to be incident on the collimating lens 2 such that an angle of approximately 5° is obtained between the collimated light emitted from the collimating lens 2 after being emitted from the semiconductor laser element 25, and the optical axis of the collimating lens 2.

Also, in this simulation, the observation plane 4 irradiated by collimated light passing through the spacing d between the photodiodes 31 and 32 is disposed at a position distanced from the photodetector areas J of the photodiodes 31 and 32 by 5.0 mm in the horizontal optical axis direction (the direction parallel to the optical axis of the collimating lens 2).

Also, in this simulation the photodetector areas J of the photodiodes 31 and 32 are disposed at positions distanced from the axis of symmetry for the collimating lens 2 by 2.0 mm in the horizontal optical axis direction.

In addition, in this simulation, a distribution of electric field strength for collimated light is obtained for the case where the collimated light irradiating the observation plane 4 spreads a maximum of ±0.6 mm in the vertical optical axis direction with reference to the center 0 of a potential irradiated area 55 (refer to the enlarged figure). Herein, the vertical optical axis direction refers to the direction that orthogonally intersects the optical axis of the collimating lens 2, and in addition, is parallel to the layout direction of the semiconductor laser elements 21 to 27.

Note that in this simulation, the beam radius w of collimated light emitted from the collimating lens 2 (the collimated light corresponding to the laser light emitted from the semiconductor laser element 25) is set to 0.4 mm, similarly to the case of FIG. 3.

FIGS. 5A to 5D illustrate respective simulation results for when, given the parameters discussed above, the spacing d between the photodiodes 31 and 32 is set to 2.5 times the beam radius w at 1.0 mm, 3.0 times the beam radius w at 1.2 mm, 4.0 times the beam radius w at 1.6 mm, and 5.0 times the beam radius w at 2.0 mm. Note that in FIGS. 5A to 5D, the vertical axis represents the relative electric field strength normalized to the maximum value of the electric field strength, while the horizontal axis represents the position in the horizontal optical axis direction (the position on a line taking the center 0 of the irradiated area 55 to be 0.0 mm).

Figure 5A:
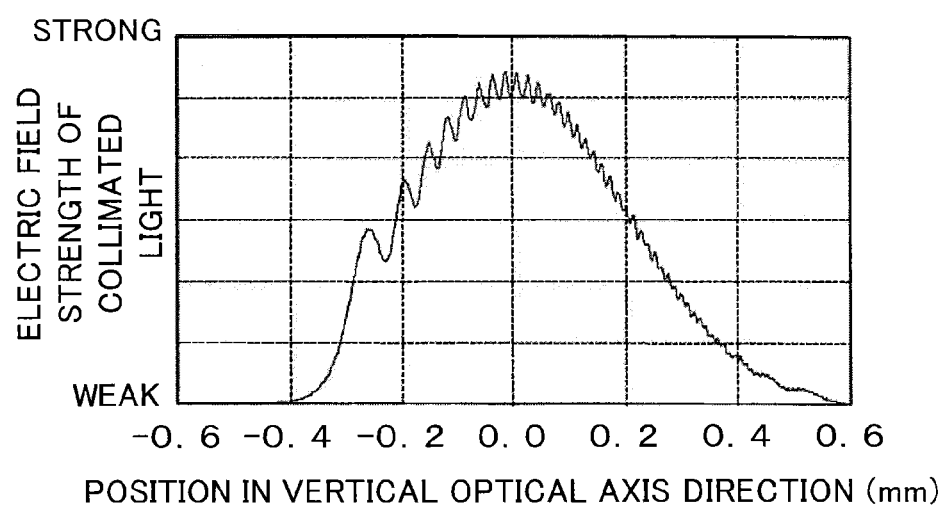
FIGS. 5A to 5D are diagrams illustrating simulation results for electric field strength.

As illustrated in FIG. 5A, in the case where the spacing d between the photodiodes 31 and 32 is 2.5 times the beam radius w (1.0 mm), disturbance occurs in the electric field strength of collimated light passing through the spacing d. Thus, the collimated light in this case loses a Gaussian distribution (see FIG. 2).

This is because the path 45 is obstructed by the photodiode 32, and diffracted light from the photodiode 32 as well as reflected light from the photodiode 32 are combined with collimated light propagating along the path 45.

Figure 5B:
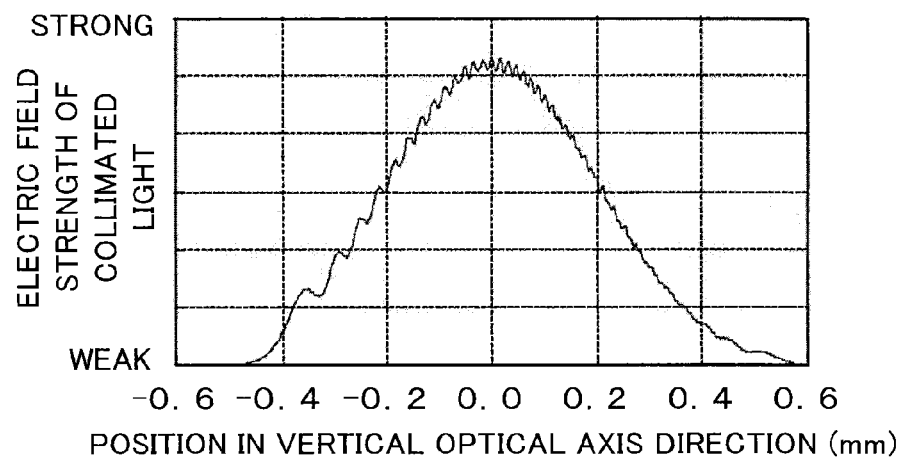

Meanwhile, as illustrated in FIG. 5B, in the case where the spacing d between the photodiodes 31 and 32 is 3.0 times the beam radius w (1.2 mm), disturbance in the electric field strength of collimated light passing through the spacing d is somewhat mitigated. Thus, the collimated light in this case becomes close to having an ideal Gaussian distribution (see FIG. 2).

Figure 5C:
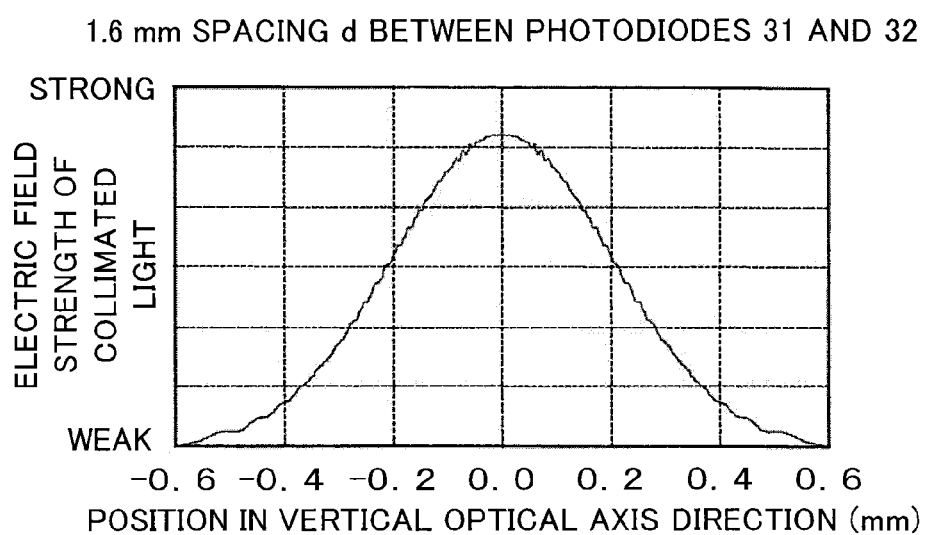
Figure 5D:
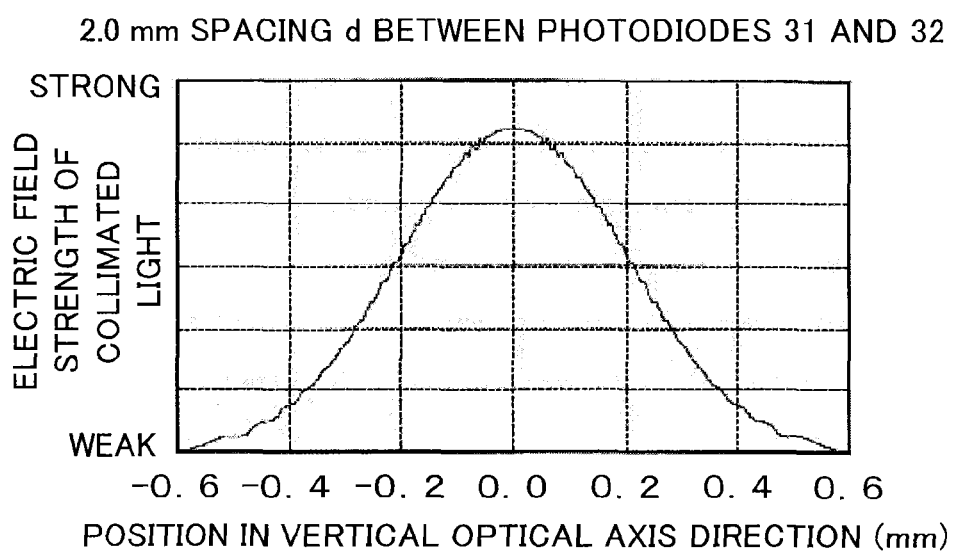

Furthermore, as illustrated in FIGS. 5C and 5D, in the cases where the spacing d between the photodiodes 31 and 32 is 4.0 times the beam radius w (1.6 mm) and 5.0 times the beam radius w (2.0 mm), almost no disturbance occurs in the electric field strength of collimated light passing through the spacing d. For this reason, the collimated light in this case becomes extremely close to having an ideal Gaussian distribution (see FIG. 2).

In this way, in the case where the spacing d between the photodiodes 31 and 32 is equal to or greater than 3.0 times the beam radius w (1.2 mm), the collimated light passing through the spacing d becomes close to an having ideal Gaussian distribution (see FIG. 2).

For this reason, by setting the spacing d between the photodiodes 31 and 32 equal to or greater than 3.0 times the beam radius w (1.2 mm), the laser module 100 enables measurement of the sum of photodetector current values, and as a result, enables computation of the intensity of each beam of collimated light.

On the basis of the simulation results in FIG. 5 and the simulation results in FIG. 3 discussed above, the spacing d between the photodiodes 31 and 32 in a laser module 100 according to Embodiment 1 is set to be equal to or greater than 3.0 times the beam radius of collimated light emitted from the collimating lens 2, and less than or equal to 6.0 times the beam radius of collimated light. Thus, the laser module 100 realizes a spacing that enables measurement of the sum of photodetector current values, even when detecting a portion of collimated light, while also restraining disturbances in the electric field strength of the collimated light. Thus, according to the laser module 100, measurement of the sum of photodetector current values is enabled, and as a result, computation of the intensity of each beam of collimated light is enabled.

In this way, with the positioning of photodiodes 31 and 32, a laser module 100 according to Embodiment 1 enables computation of the intensity of collimated light by detecting a portion of that collimated light, while restraining disturbances in the electric field strength of the collimated light (in other words, while suppressing effects on the collimated light). Thus, since a beam splitter is unnecessary, the laser module 100 is easier to miniaturize compared to a laser module that uses a beam splitter.

Herein, the spacing d between the photodiodes 31 and 32 depends on the beam radius w of the collimated light emitted from the collimating lens 2, as discussed above. For this reason, the following values that do not affect the spacing d between the photodiodes 31 and 32 are not limited to the values indicated in Embodiment 1, and may be freely set. Namely, the spacing and number of disposed semiconductor laser elements 21 to 27, the shape and size of the collimating lens 2, the shapes and sizes of the photodiodes 31 and 32, the shapes and sizes of the photodetector areas J, and the output power of each of the semiconductor laser elements 21 to 27 may be freely set insofar as the light emitted from the collimating lens 2 is collimated light.

Additionally, in the simulation in FIG. 4, laser light emitted from the semiconductor laser element 25 is made to be incident on the collimating lens 2 such that an angle of approximately 5° is obtained between the collimated light emitted from the collimating lens 2 after being emitted from the semiconductor laser element 25, and the optical axis of the collimating lens 2. However, this angle is not limited to approximately 5°, and may be freely set insofar as the light emitted from the collimating lens 2 is collimated light.

Moreover, in the simulation in FIG. 4, the observation plane 4 irradiated by collimated light is disposed at a position distanced from the photodetector areas J of the photodiodes 31 and 32 by 5.0 mm in the horizontal optical axis direction. Also, the photodetector areas J of the photodiodes 31 and 32 are disposed at positions distanced from the axis of symmetry for the collimating lens 2 by 2.0 mm in the horizontal optical axis direction. However, the position of the observation plane 4 and the positions of the photodetector areas J may be freely set insofar as the light emitted from the collimating lens 2 is collimated light.

Also, the spacing d between the photodiodes 31 and 32 depends on the beam radius w of the collimated light emitted from the collimating lens 2, as discussed above. For this reason, in the case where it is desirable to modify the beam radius w of collimated light emitted from the collimating lens 2, it is sufficient to modify the spacing d between the photodiodes 31 and 32 to match the desired beam radius w on the basis of the configuration illustrated in Embodiment 1. Thus, the beam radius w of collimated light emitted from the collimating lens 2 may also be freely set.

Embodiment 2

Figure 6:
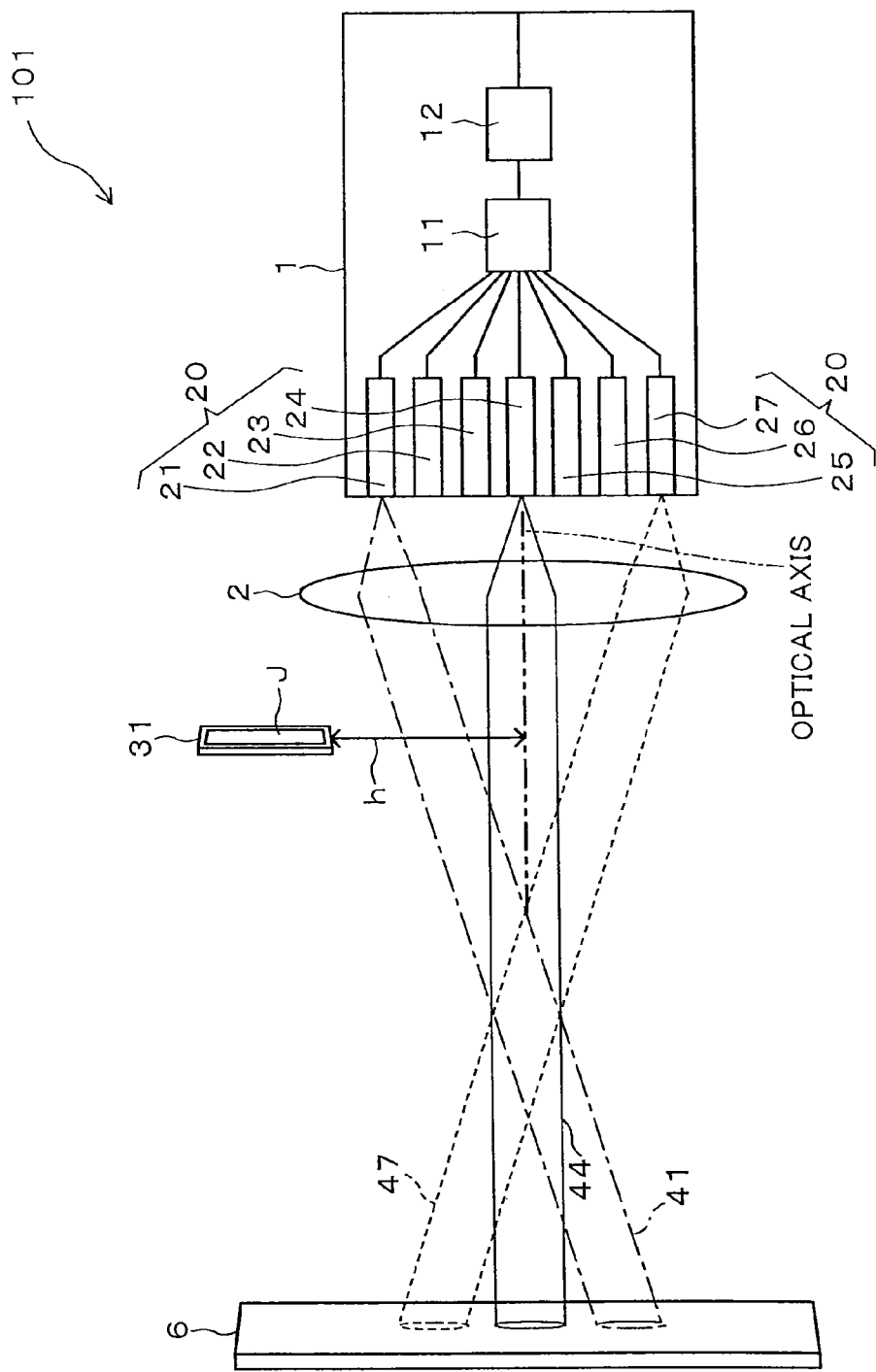
FIG. 6 is a configuration diagram of a laser module according to Embodiment 2 of the present invention.

Next, a laser module 101 according to Embodiment 2 of the present invention will be described with reference to FIG. 6. The laser module 101 is a partial modification of the laser module 100 according to Embodiment 1. Specifically, the laser module 101 is the laser module 100 without the photodiode 32. Thus, in the laser module 101, the same configuration elements as those of the laser module 100 are labeled with the same numbers, and are not explained below.

The laser module 101 uses just the photodiode 31 to enable measurement of the sum of photodetector current values, even when detecting a portion of collimated light, while also restraining disturbances in the electric field strength of the collimated light.

In the laser module 101, the photodetector area J of the photodiode 31 is disposed facing the direction of the collimating lens 2 on a line which is parallel to the layout direction of the semiconductor laser elements 21 to 27 and which orthogonally intersects the optical axis of the collimating lens 2. Thus, the photodetector area J of the photodiode 31 is disposed along the propagation paths 41 to 47 of collimated light emitted from the collimating lens 2.

Also, the photodetector area J of the photodiode 31 is disposed with respect to the optical axis of the collimating lens 2 as a reference point, at a position a distance h away from the reference point.

By being disposed in this way, the photodiode 31 may be disposed at a position distanced from the central axis of the individual beams of collimated light. Thus, the photodetector area J of the photodiode 31 is able to detect a portion of collimated light for all individual beams of collimated light emitted from the collimating lens 2.

Herein, the distance h where the photodetector area J of the photodiode 31 is positioned is half the distance of the spacing d between the photodiodes 31 and 32 in the laser module 100 according to Embodiment 1. Specifically, the distance h where the photodetector area J of the photodiode 31 is positioned is a distance that is equal to or greater than 1.5 times the beam radius w but less than or equal to 3.0 times the beam radius w of the collimated light, taking the optical axis of the collimating lens 2 as a reference point.

The reasons for setting this distance will now be explained. First, the reason for disposing the photodiode 31 at a distance equal to or greater than 1.5 times the beam radius w will be described.

In the laser module 100 according to Embodiment 1, the spacing d between the photodiodes 31 and 32 is set to be equal to or greater than 3.0 times the beam radius w with the optical axis of the collimating lens 2 as midpoint, for the reason of not disturbing the electric field strength of collimated light passing through the spacing d. In other words, in the laser module 100, the photodiode 31 and the photodiode 32 are each disposed at a distance equal to or greater than 1.5 times the beam radius w of the collimated light, taking the optical axis of the collimating lens 2 as a reference point. Applying this technology, in a laser module 101 using the photodiode 31 only, the photodiode 31 is likewise disposed at a distance equal to or greater than 1.5 times the beam radius w of collimated light, taking the optical axis of the collimating lens 2 as a reference point.

Next, the reason for disposing the photodiode 31 at a distance less than or equal to 3.0 times the beam radius w will be described.

In the laser module 100 according to Embodiment 1, the spacing d between the photodiodes 31 and 32 is set to be less than or equal to 6.0 times the beam radius w, taking the optical axis of the collimating lens 2 as midpoint, from the perspective of the photodetector currents of the photodiodes 31 and 32, and more specifically, from the perspective of dynamic range and the perspective of current value measurement. In other words, in the laser module 100, the photodiode 31 and the photodiode 32 are each disposed at a distance less than or equal to 3.0 times the beam radius w of the collimated light, taking the optical axis of the collimating lens 2 as a reference point. Applying this technology, in a laser module 101 using the photodiode 31 only, the photodiode 31 is likewise disposed at a distance less than or equal to 3.0 times the beam radius w of collimated light, taking the optical axis of the collimating lens 2 as a reference point.

In this way, the technology from the laser module 100 according to Embodiment 1 is applied to the laser module 101 to determine the distance h where the photodiode 31 is disposed. Thus, the laser module 101 enables measurement of the sum of photodetector current values, even when detecting a portion of collimated light, while also restraining disturbances in the electric field strength of the collimated light (in other words, while suppressing effects on the collimated light). Consequently, according to the laser module 101, measurement of the sum of photodetector current values is enabled, and as a result, computation of the intensity of each beam of collimated light is enabled.

In this way, with the positioning of a photodiode 31, a laser module 101 according to Embodiment 2 enables computation of the intensity of collimated light by detecting a portion of that collimated light, while restraining disturbances in the electric field strength of the collimated light (in other words, while suppressing effects on the collimated light). Thus, since a beam splitter is unnecessary, the laser module 101 is easier to miniaturize compared to a laser module that uses a beam splitter.

Embodiment 3

Figure 7:
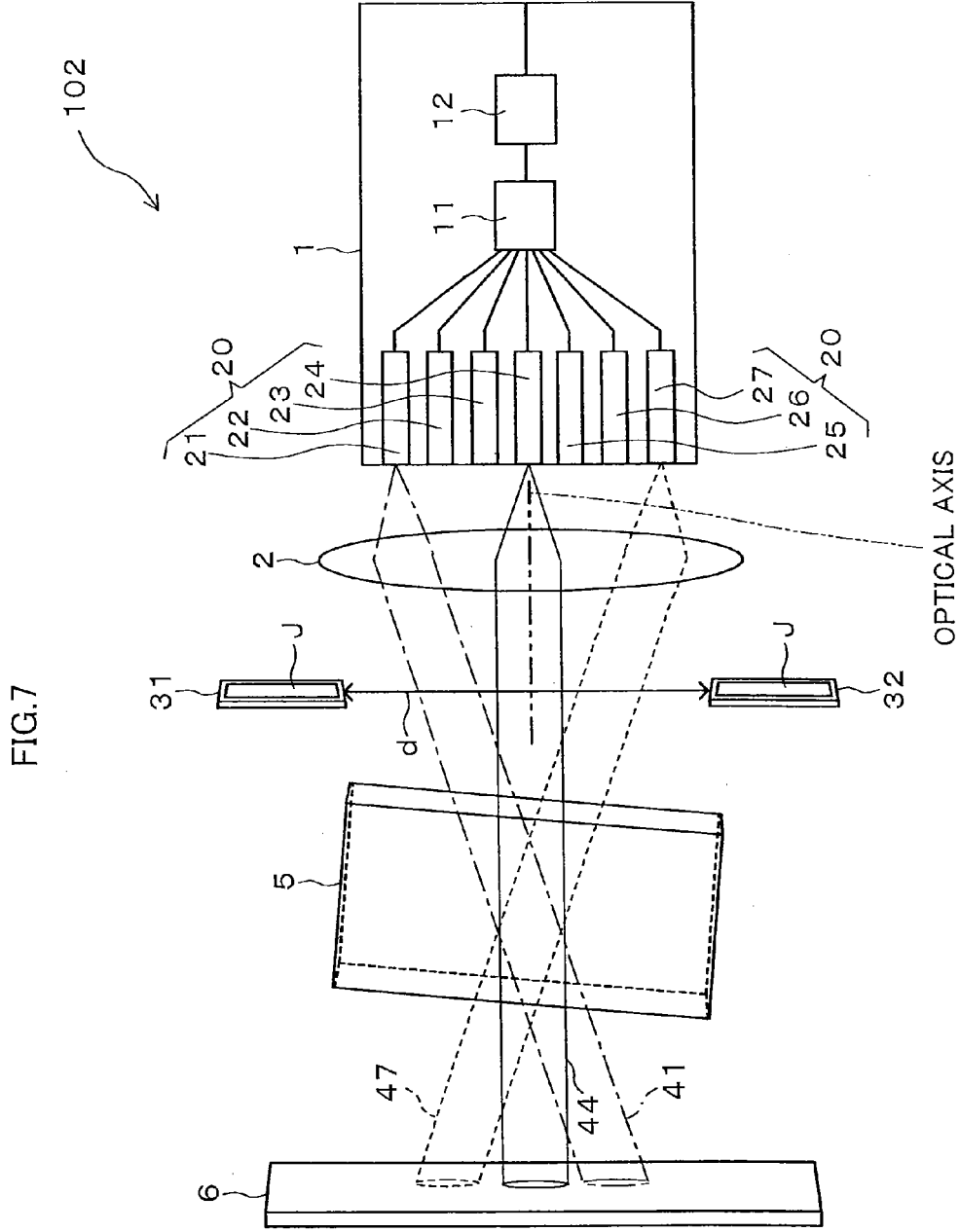
FIG. 7 is a configuration diagram of a laser module according to Embodiment 3 of the present invention.

Next, a laser module 102 according to Embodiment 3 of the present invention will be described with reference to FIG. 7. The laser module 102 is a partial modification of the laser module 100 according to Embodiment 1. Thus, in the laser module 102, the same configuration elements as those of the laser module 100 are labeled with the same numbers, and are not explained below.

The laser module 102 is equipped with a semiconductor substrate 1, a collimating lens 2, photodiodes 31 and 32, an etalon 5, and an irradiated photodiode 6.

In other words, the laser module 102 is the laser module 100 according to Embodiment 1 with the addition of an etalon 5 and an irradiated photodiode 6.

The etalon 5 is disposed at a position obstructing all of the propagation paths 41 to 47 of collimated light emitted from the collimating lens 2.

The etalon 5 is a combination of two reflecting mirrors facing each other in parallel. The length of the etalon 5 and the angle of the etalon 5 with respect to the laser light are adjusted such that the optical path difference of the respective beams of reflected light multiply reflected between the two reflecting mirrors in the etalon 5 becomes an integer multiple of the wavelength. Thus, the etalon 5 allows the passage (transmission) of desired collimated light, while suppressing the passage (transmission) of undesired collimated light. For this reason, the etalon 5 transmits collimated light at a transmittance that depends on the wavelength of the collimated light. As a result, the intensity of collimated light transmitted through the etalon 5 depends on the wavelength.

At this point, the specific transmittance (wavelength dependency) of the etalon 5 may be computed as follows, for example. First, a measuring apparatus measures a photodetector current by emitting scattered light from a light source able to vary the wavelength, converting the scattered light into collimated light with a collimating lens, and detecting the collimated light with a photodiode.

Next, a photodiode is disposed downstream to the etalon 5, and the measuring apparatus measures a photodetector current by irradiating the etalon 5 with collimated light converted by the collimating lens, and detecting the transmitted light transmitted by the etalon 5 with a photodiode.

Then, the measuring apparatus computes the ratio of the photodetector current for the case of collimated light not transmitted through the etalon 5 versus the photodetector current for the case of collimated light transmitted through the etalon 5. By executing the above at arbitrary wavelength intervals, the measuring apparatus is able to compute the specific transmittance of the etalon 5 within a specific wavelength range.

The irradiated photodiode 6 detects collimated light transmitted by the etalon 5 on a square photosensitive areas which is 900 μm long on one edge, and outputs signals (currents) corresponding to the detected intensities of the individual beams of collimated light. Specifically, the photodetector currents which are output by the irradiated photodiode 6 increase as the intensity of the collimated light detected by the photosensitive area increases, whereas the currents which are output decrease as the intensity of the collimated light detected by the photosensitive area decreases.

Similarly to a laser module 101 according to Embodiment 1, the laser module 102 equipped with the etalon 5 and irradiated photodiode 6 discussed above uses the photodiodes 31 and 32 to enable measurement of the sum of photodetector current values, even when detecting a portion of collimated light, while also restraining disturbances in the electric field strength of the collimated light. Furthermore, by utilizing the transmittance of a wavelength-dependent etalon 5, the laser module 102 enables detection of laser light wavelength variance which may be produced by the semiconductor laser elements 21 to 27. Such laser light wavelength variance is produced over time and according to temperature changes in the semiconductor laser elements 21 to 27.

Laser light wavelength variance may be detected as follows.

First, a measuring apparatus causes one of the semiconductor laser elements 21 to 27 to emit laser light. Next, the measuring apparatus acquires the sum of photodetector current values from the photodiodes 31 and 32 and the photodetector current value from the irradiated photodiode 6 with a measuring instrument (a personal computer, for example).

The measuring apparatus then causes the measuring instrument to compute the transmittance of collimated light in the form of the ratio of the sum of photodetector current values from the photodiodes 31 and 32 versus the photodetector current value from the irradiated photodiode 6.

The measuring apparatus then causes the measuring instrument to compare the computed transmittance of collimated light against the specific transmittance of the etalon 5 (the transmittance corresponding to the wavelength of the laser light), and causes the measuring instrument to determine if the transmittance values differ. If the measuring instrument determines that the transmittance values differ, variation is being produced in the wavelength of laser light emitted from the semiconductor laser element. According to this configuration, it is possible to detect whether variation exists in the wavelength of laser light emitted from a semiconductor laser element. It may also be configured such that if the transmittance values match at this point, the measuring instrument is made to report a match, whereas if the transmittance values do not match, the measuring instrument is made to report a mismatch. The measuring apparatus may also use such reports to tune the wavelengths of laser light emitted from the semiconductor laser elements 21 to 27 so as to match a specific wavelength.

By causing the measuring instrument to execute the above determination for all of the semiconductor laser elements 21 to 27, the measuring apparatus is able to detect laser light wavelength variation which may be produced in the semiconductor laser elements 21 to 27 over time and according to temperature changes. Additionally, the measuring apparatus is also able to perform tuning.

Note that although the specific transmittance of the etalon 5 changes over time and according to temperature changes in the etalon 5, such change is insignificant enough to ignore compared to the variation in the wavelength of the laser light.

As discussed above, the laser module 102 enables detection of whether variation exists in the wavelength of laser light emitted from the semiconductor laser elements 21 to 27. Additionally, the laser module 102 enables tuning of the wavelengths of laser light emitted from the semiconductor laser elements 21 to 27 so as to match a specific wavelength.

Moreover, with an arrangement of photodiodes 31 and 32, the laser module 102 enables computation of the intensity of collimated light by detecting a portion of that collimated light, while restraining disturbances in the electric field strength of the collimated light (in other words, while suppressing effects on the collimated light), similarly to the laser module 100 according to Embodiment 1 as discussed earlier. Thus, since a beam splitter is unnecessary, the laser module 102 is likewise easier to miniaturize compared to a laser module that uses a beam splitter, similarly to the laser module 100.

Embodiment 4

Figure 8:
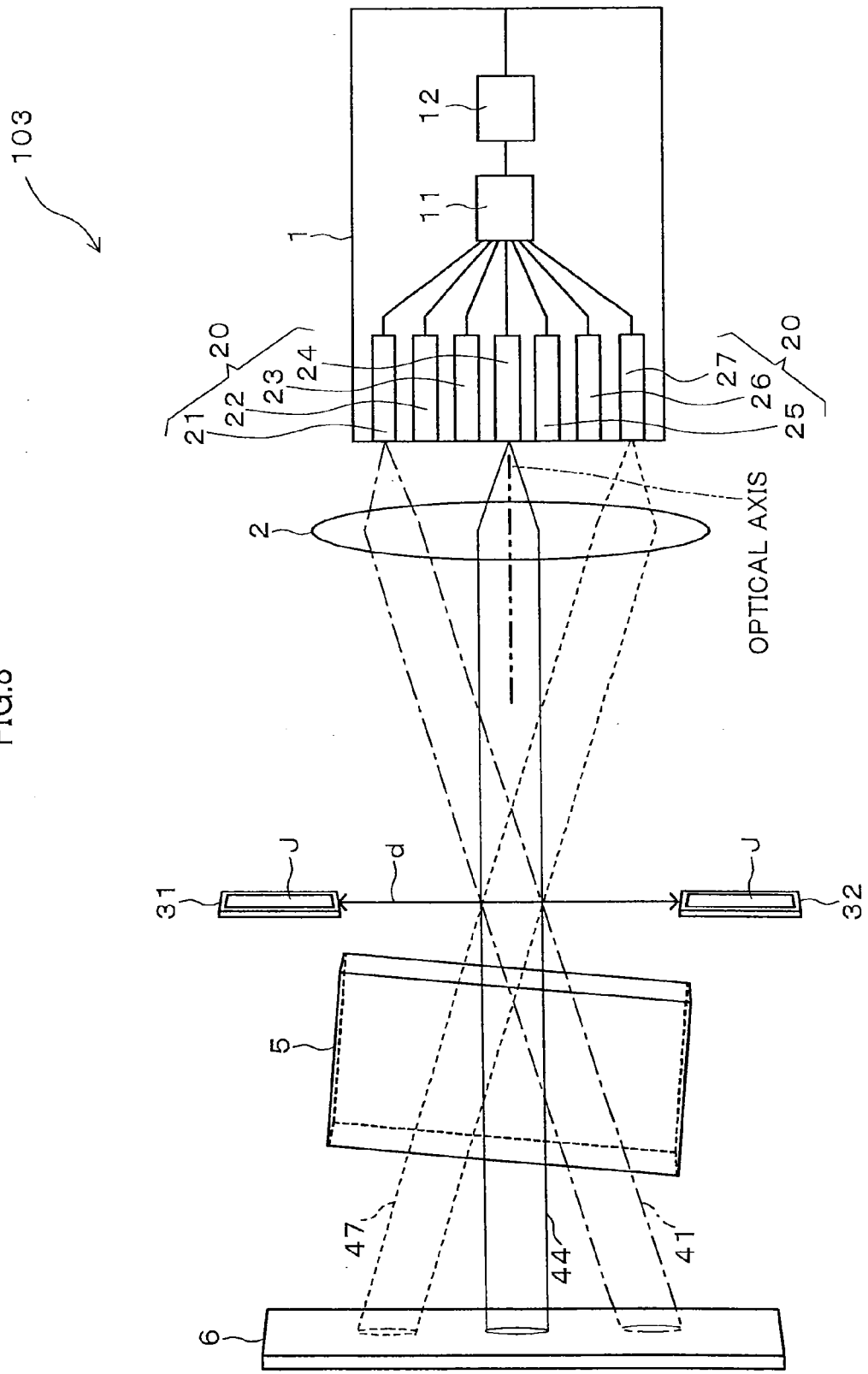
FIG. 8 is a configuration diagram of a laser module according to Embodiment 4 of the present invention.

Next, a laser module 103 according to Embodiment 4 of the present invention will be described with reference to FIG. 8. The laser module 103 is a partial modification of the laser module 102 according to Embodiment 3. Thus, in the laser module 103, the same configuration elements as those of the laser module 102 are labeled with the same numbers, and are not explained below.

In the laser module 103, the photodiodes 31 and 32, the etalon 5, and the irradiated photodiode 6 are further distanced from the collimating lens 2 compared to the laser module 102. Other features of the configuration of the laser module 103 are identical to the laser module 102.

The collimating lens 2 emits collimated light such that all of the propagation paths 41 to 47 of collimated light intersect at one location.

Similarly to the laser module 102 according to Embodiment 3, the respective photodetector areas J of the photodiodes 31 and 32 are disposed facing the direction of the collimating lens 2 on a line which is parallel to the layout direction of the semiconductor laser elements 21 to 27 and which orthogonally intersects the optical axis of the collimating lens 2. Also, the respective photodetector areas J of the photodiodes 31 and 32 are disposed at equally spaced intervals from each other with the optical axis of the collimating lens 2 as the midpoint.

In addition, the respective photodetector areas J of the photodiodes 31 and 32 are disposed at positions such that the one location where all the propagation paths 41 to 47 of collimated light emitted from the collimating lens 2 lies between the photodetector areas J.

According to this configuration, unlike the laser module 102 according to Embodiment 3 in which all the propagation paths 41 to 47 of collimated light do not intersect at one location, in the laser module 103 the sums of photodetector current values from the photodiodes 31 and 32 are made constant, irrespective of the semiconductor laser elements 21 to 27 from which laser light is emitted. Thus, according to the laser module 103, more precise computation of the collimated light intensity from the sum of photodetector current values from the photodiodes 31 and 32 is enabled compared to the laser module 102.

Moreover, with an arrangement of photodiodes 31 and 32, the laser module 103 enables computation of the intensity of collimated light by detecting a portion of that collimated light, while restraining disturbances in the electric field strength of the collimated light (in other words, while suppressing effects on the collimated light), similarly to the laser module 102 according to Embodiment 3. Thus, since a beam splitter is unnecessary, the laser module 103 is likewise easier to miniaturize compared to a laser module that uses a beam splitter, similarly to the laser module 102.

Furthermore, the laser module 103 enables detection of laser light wavelength variation, similarly to the laser module 102 according to Embodiment 3.

Note that although the laser module 103 uses the two photodiodes 31 and 32, one of either the photodiode 31 or the photodiode 32 may also be used.

Embodiment 5

Figure 9:
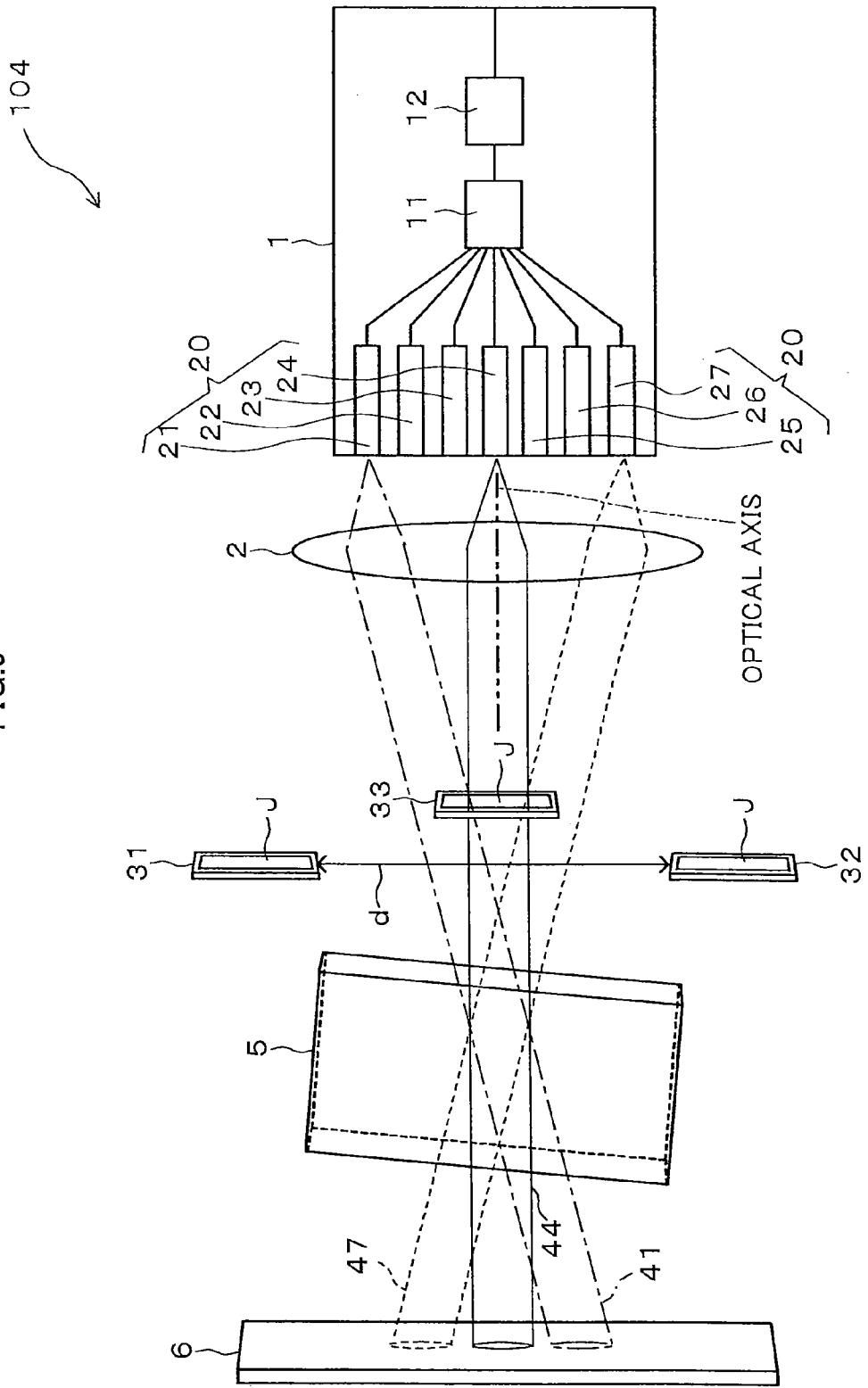
FIG. 9 is a configuration diagram of a laser module according to Embodiment 5 of the present invention.

Next, a laser module 104 according to Embodiment 5 of the present invention will be described with reference to FIG. 9. The laser module 104 is a partial modification of the laser module 102 according to Embodiment 3. Thus, in the laser module 104, the same configuration elements as those of the laser module 102 are labeled with the same numbers, and are not explained below.

The laser module 104 is the laser module 102 with the addition of a photodiode 33. Other features of the configuration of the laser module 104 are identical to the laser module 102.

The photodiode 33 has the same configuration as the photodiodes 31 and 32. The photodetector area J of the photodiode 33 is disposed facing the direction of the collimating lens 2 on a line which is perpendicular to the layout direction of the semiconductor laser elements 21 to 27 and which orthogonally intersects the optical axis of the collimating lens 2. Also, for reasons similar to the case of the laser module 101 according to Embodiment 2 (in order to enable measurement of the sum of photodetector current values, even when detecting a portion of collimated light, while also restraining disturbances in the electric field strength of the collimated light), the photodetector area J of the photodiode 33 is positioned at a distance that is equal to or greater than 1.5 times the beam radius w but less than or equal to 3.0 times the beam radius w of collimated light, taking the optical axis of the collimating lens 2 as a reference point.

According to this configuration, the laser module 104 makes it possible to allow a measuring instrument (a personal computer, for example) to compute collimated light intensity using a sum of photodetector current values from three photodiodes 31, 32, and 33.

Also, by applying the technology of the laser module 102 according to Embodiment 3, the laser module 104 makes it possible to allow a measuring instrument (a personal computer, for example) to compute the transmittance of collimated light from the ratio of the sum of photodetector current values from the photodiodes 31, 32, and 33 versus the photodetector value from the irradiated photodiode 6, and detect laser light wavelength variation.

In this way, since three photodiodes are used, the laser module 104 enables more precise detection of laser light wavelength variance in addition to enabling more precise computation of collimated light intensity compared to the laser module 102 which uses two photodiodes.

Moreover, with an arrangement of photodiodes 31 and 32, the laser module 104 enables computation of the intensity of collimated light by detecting a portion of that collimated light, while restraining disturbances in the electric field strength of the collimated light (in other words, while suppressing effects on the collimated light), similarly to the laser module 102. Thus, since a beam splitter is unnecessary, the laser module 104 is likewise easier to miniaturize compared to a laser module that uses a beam splitter, similarly to the laser module 102.

Note that although the laser module 104 uses the three photodiodes 31, 32, and 33, the photodiodes 31 and 32 may be removed and just the photodiode 33 may be used in cases where high precision is not demanded, for example.

Embodiment 6

Figure 10:
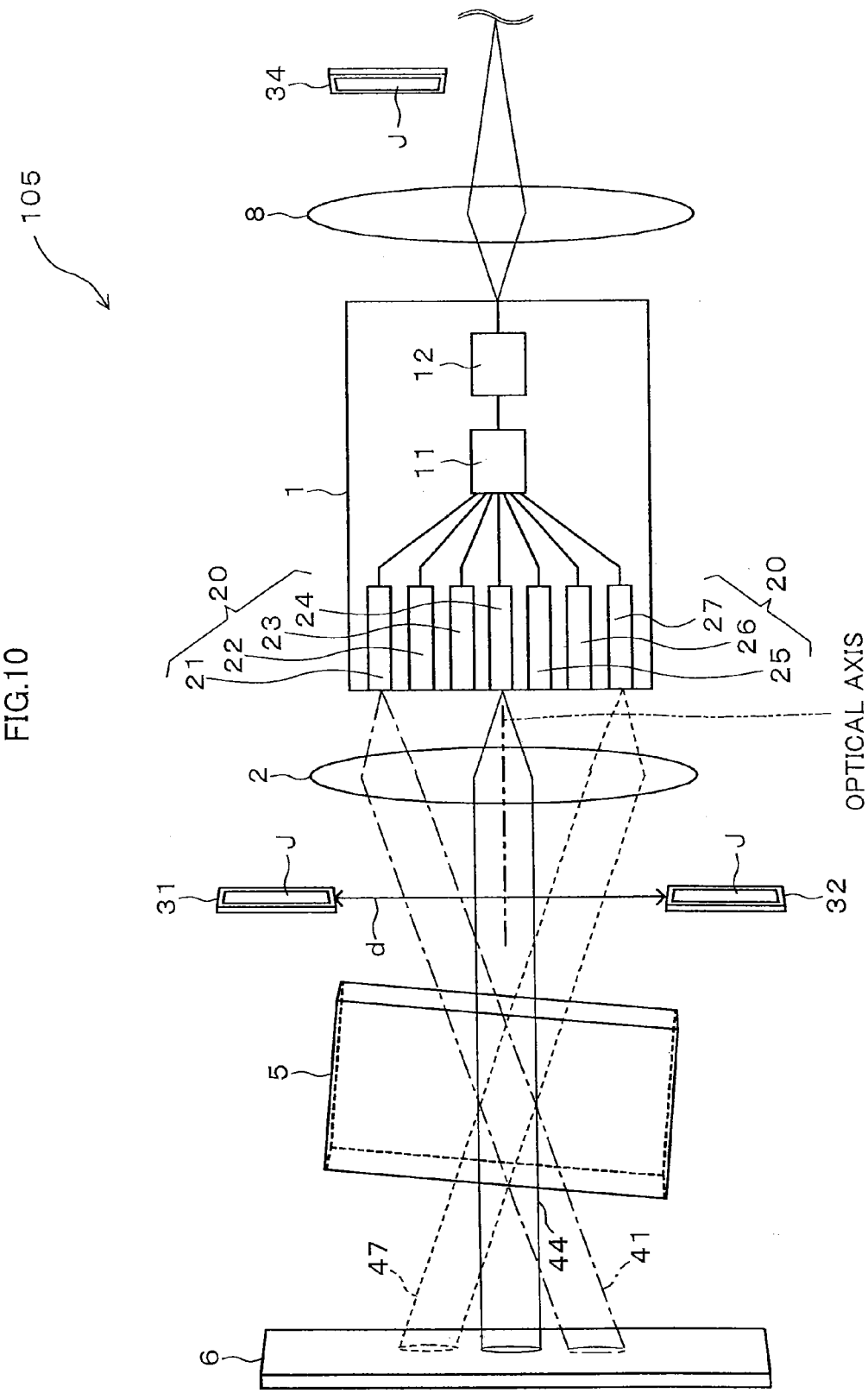
FIG. 10 is a configuration diagram of a laser module according to Embodiment 6 of the present invention.

Next, a laser module 105 according to Embodiment 6 of the present invention will be described with reference to FIG. 10. The laser module 105 is a modification of the laser module 102 according to Embodiment 3. Thus, in the laser module 105, the same configuration elements as those of the laser module 102 are labeled with the same numbers, and are not explained below.

The laser module 105 is the laser module 102 with the addition of a condenser lens 8 and a photodiode 34. Otherwise, the configuration is identical to the laser module 102.

The condenser lens 8 is a lens that condenses and emits output light (scattered light) output from the optical amplifier 12.

The photodiode 34 has the same configuration as the photodiodes 31 and 32. The photodetector area J of the photodiode 34 is disposed at a position able to measure a photodetector current, even when detecting a portion of light, while also restraining disturbances in the electric field strength of the light emitted from the condenser lens 8.

The photodetector area J of the photodiode 34 is, for example, disposed on a line which is parallel to the layout direction of the semiconductor laser elements 21 to 27 and which orthogonally intersects the optical axis of the condenser lens 8. In addition, taking the optical axis of the condenser lens 8 as a reference point, the photodetector area J of the photodiode 34 is, for example, disposed from at a distance from that reference point which is equal to or greater than 1.5 times the beam radius w but less than or equal to 3.0 times the beam radius w of the collimated light emitted from the collimating lens 2.

By disposing the photodiode 34 in this way, the laser module 105 enables detection of change over time in the optical multiplexer 11 and the optical amplifier 12.

The detection of change over time in the optical multiplexer 11 and the optical amplifier 12 may be configured as follows, for example. Namely, a measuring apparatus directs a measuring instrument (a personal computer, for example) to store the photodetector current value from the photodiode 34 and the sum of photodetector current values from the photodiodes 31 and 32 each time a measurement is made. The measuring apparatus then causes the measuring instrument to compare the present value of the photodetector current against past values for the photodiode 34, and additionally compare the present value of the sum of photodetector current values against past values for the photodiodes 31 and 32. In the case where the measuring instrument determines that the present value of the photodetector current differs from past values in the photodiode 34 (for example, in the case where the measuring instrument determines that the present value of the photodetector current is less than past values in the photodiode 34), the measuring apparatus causes the measuring instrument to issue a report indicating a worsening over time in the optical multiplexer 11 and the optical amplifier 12, irrespective of whether or not the present value of the sum of photodetector current values are the same as past values in the photodiodes 31 and 32.

As described above, the laser module 105 enables detection of change over time in the optical multiplexer 11 and the optical amplifier 12.

Moreover, with an arrangement of photodiodes 31 and 32, the laser module 105 enables computation of the intensity of collimated light by detecting a portion of that collimated light, while restraining disturbances in the electric field strength of the collimated light (in other words, while suppressing effects on the collimated light), similarly to the laser module 102 according to Embodiment 3. Thus, since a beam splitter is unnecessary, the laser module 105 is likewise easier to miniaturize compared to a laser module that uses a beam splitter, similarly to the laser module 102.

Furthermore, the laser module 105 enables detection of laser light wavelength variation, similarly to the laser module 102 according to Embodiment 3.

Embodiment 7

Figure 11:
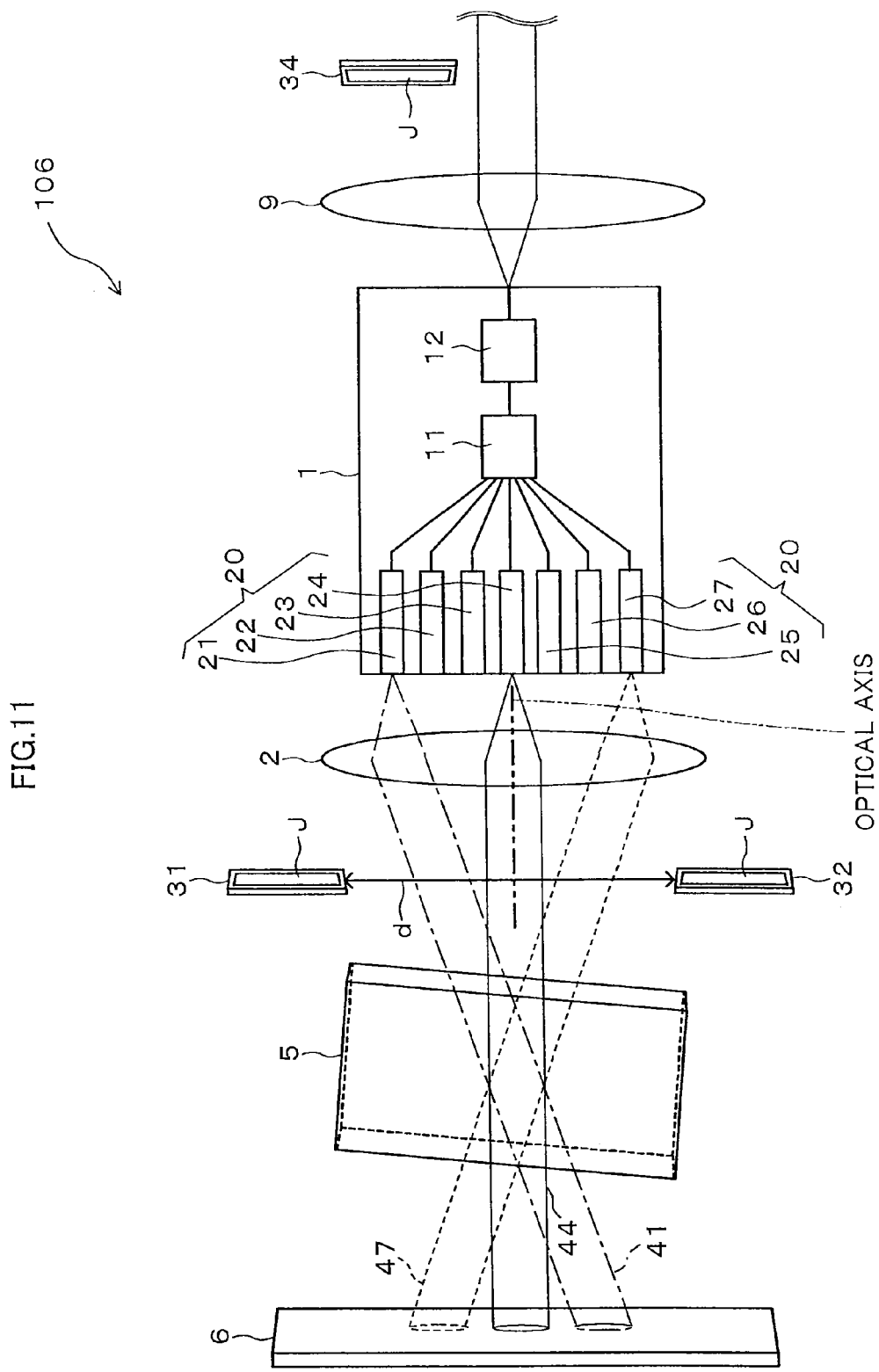
FIG. 11 is a configuration diagram of a laser module according to Embodiment 7 of the present invention.

Next, a laser module 106 according to Embodiment 7 of the present invention will be described with reference to FIG. 11. The laser module 106 is a modification of the laser module 105 according to Embodiment 6. Thus, in the laser module 106, the same configuration elements as those of the laser module 105 are labeled with the same numbers, and are not explained below.

In the laser module 106, a collimating lens 9 is used instead of the condenser lens 8 used in the laser module 105. Otherwise, the configuration is identical to the laser module 105.

The collimating lens 9 has the same configuration as the collimating lens 2. The collimating lens 9 collimates output light (scattered light) output from the optical amplifier 12 to emit collimated light.

Note that to accommodate the change from the condenser lens 8 to the collimating lens 9, the photodetector area J of the photodiode 34 is, for example, disposed on a line which is parallel to the layout direction of the semiconductor laser elements 21 to 27 and which orthogonally intersects the optical axis of the collimating lens 9. In addition, taking the optical axis of the collimating lens 9 as a reference point, the photodetector area J of the photodiode 34 is, for example, disposed from at a distance from that reference point which is equal to or greater than 1.5 times the beam radius w but less than or equal to 3.0 times the beam radius w of the collimated light emitted from the collimating lens 9.

Thus, the photodetector area J of the photodiode 34 is disposed at a position able to measure a photodetector current, even when detecting a portion of light emitted from the collimating lens 9, while also restraining disturbances in the electric field strength of the light emitted from the collimating lens 9.

In this way, even if a collimating lens 9 is used, the laser module 106 enables comparison of the present value of the photodetector current against past values for the photodiode 34, as well as comparison of the present value of the sum of photodetector current values against past values for the photodiodes 31 and 32, thereby enabling detection of change over time in the optical multiplexer 11 and the optical amplifier 12, similarly to the laser module 105 according to Embodiment 6.

Moreover, with an arrangement of photodiodes 31 and 32, the laser module 106 enables computation of the intensity of collimated light by detecting a portion of that collimated light, while restraining disturbances in the electric field strength of the collimated light (in other words, while suppressing effects on the collimated light), similarly to the laser module 105 according to Embodiment 6. Thus, since a beam splitter is unnecessary, the laser module 106 is likewise easier to miniaturize compared to a laser module that uses a beam splitter, similarly to the laser module 105.

Furthermore, the laser module 106 enables detection of laser light wavelength variation, similarly to the laser module 105 according to Embodiment 6.

Embodiment 8

Figure 12:
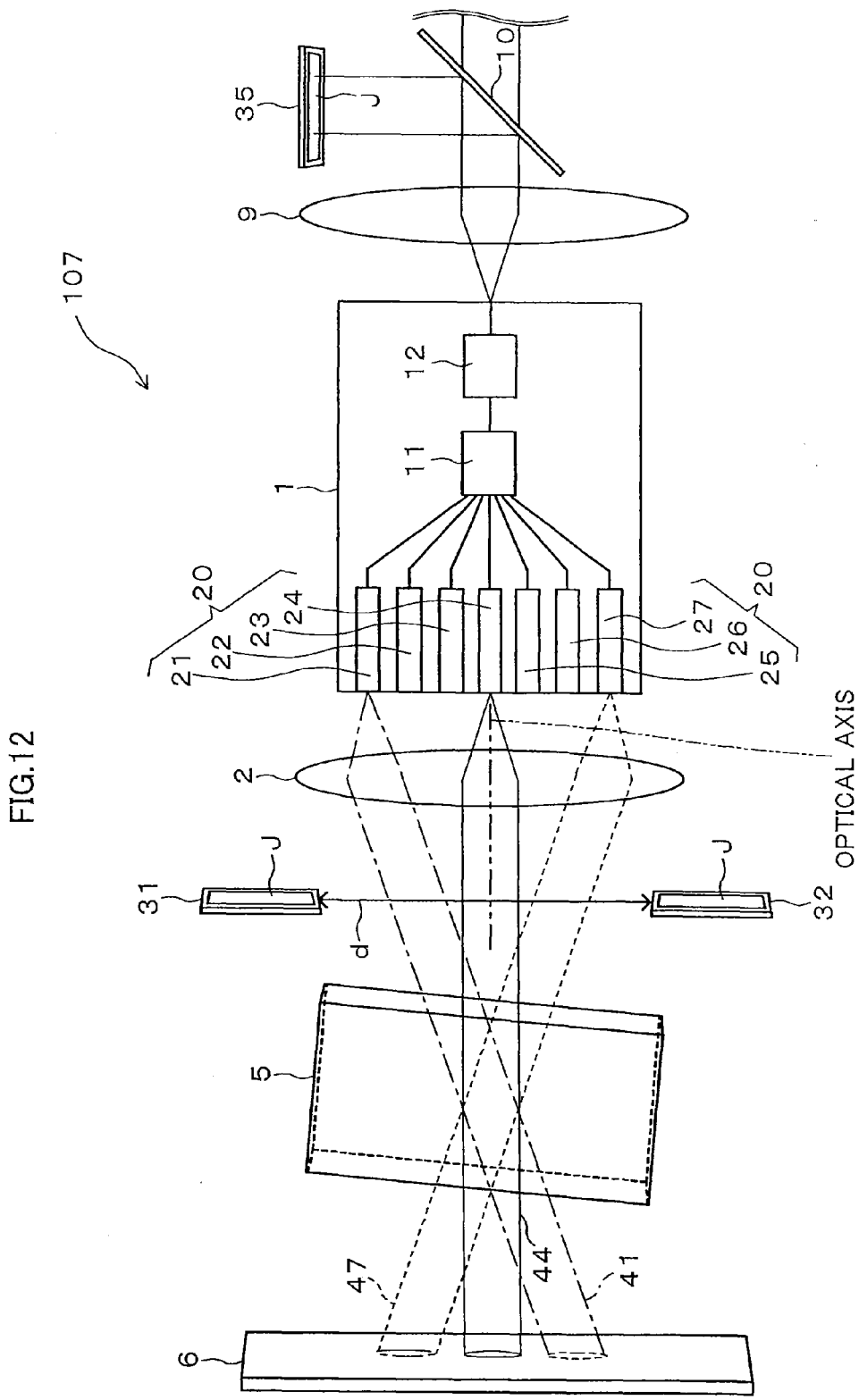
FIG. 12 is a configuration diagram of a laser module according to Embodiment 8 of the present invention.

Next, a laser module 107 according to Embodiment 8 of the present invention will be described with reference to FIG. 12. The laser module 107 is a modification of the laser module 106 according to Embodiment 7. Thus, in the laser module 107, the same configuration elements as those of the laser module 106 are labeled with the same numbers, and are not explained below.

The laser module 107 is the laser module 106 with the addition of a beam splitter 10 and a photodiode 35. Other features of the configuration of the laser module 107 are identical to the laser module 106.

The beam splitter 10 splits collimated light emitted from the collimating lens 9 into a direction parallel to the optical axis of the collimating lens 9 and a direction perpendicular to the optical axis of the collimating lens 9.

The photodiode 35 has the same configuration as the photodiodes 31 and 32. The photodetector area J of the photodiode 35 is disposed at a position that obstructs and receives collimated light split by the beam splitter 10 (the collimated light travelling in the direction perpendicular to the optical axis of the collimating lens 9).

By using a beam splitter 10 and a photodiode 35, the laser module 107 enables comparison of the present value of the photodetector current against past values for the photodiode 35, as well as comparison of the present value of the sum of photodetector current values against past values for the photodiodes 31 and 32, thereby enabling detection of change over time in the optical multiplexer 11 and the optical amplifier 12, similarly to the laser module 106 according to Embodiment 7.

Additionally, with an arrangement of photodiodes 31 and 32, the laser module 107 enables computation of the intensity of collimated light by detecting a portion of that collimated light, while restraining disturbances in the electric field strength of the collimated light (in other words, while suppressing effects on the collimated light). Thus, according to the laser module 107, miniaturization is easier compared to a laser module configured such that collimated light emitted from the collimating lens 9 is split by a beam splitter, and in addition, collimated light emitted from the collimating lens 2 is also split by a beam splitter.

Furthermore, according to the laser module 107, it is possible to detect laser light wavelength variation, similarly to the laser module 106 according to Embodiment 7.

The foregoing thus describes embodiments of the present invention, but the present invention is not limited to the above embodiments, and various modifications and applications are possible.

For example, in the sixth to eighth laser modules 105 to 107 discussed above, detection of change over time in the optical multiplexer 11 and the optical amplifier 12 is enabled by enabling comparison of the present value of the photodetector current against past values for a photodiode 34 or a photodiode 35, as well as comparison of the present value of the sum of photodetector current values against past values for the photodiodes 31 and 32. However, the present invention is not limited thereto. In other words, in the case where, for example, a modulator that modulates light output from the optical amplifier 12 is provided downstream to the optical amplifier 12 in addition to the optical multiplexer 11 and the optical amplifier 12, enabling the comparisons discussed earlier makes it possible to detect change over time in the modulator in addition to the optical multiplexer 11 and the optical amplifier 12.

As another example, in the case where only a modulator that modulates light output from the semiconductor laser elements 21 to 27 is provided on the semiconductor substrate 1 instead of the optical multiplexer 11 and the optical amplifier 12, enabling the comparisons discussed earlier makes it possible to detect change over time in the modulator.

Various embodiments and alterations of the present invention are possible without departing from the scope and spirit of the present invention. Furthermore, the foregoing embodiments are for the purpose of describing the present invention, and do not limit the scope of the present invention. In other words, the scope of the present invention is indicated by the claims rather than the foregoing embodiments. In addition, various alterations performed within the scope of the claims or within an equivalent scope of the significance of the present invention are to be regarded as being within the scope of the present invention.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

REFERENCE SIGNS LIST

1: semiconductor substrate
2, 9: Collimating lens
5: Etalon
6: Irradiated photodiode
8: Condenser lens
10: Beam splitter
11: Optical multiplexer
12: Optical amplifier
20: Laser block
21-27: Semiconductor laser element
31-35: Photodiode
41, 44, 47: Propagation path
55: Irradiated area
100-107: Laser module

The invention claimed is:

1. A laser module comprising:
a laser block that emits a plurality of beams of laser light, the laser block including a plurality of laser elements that each emit one of the plurality of beams of laser light;
a collimating lens that receives and collimates the plurality of beams of laser light emitted from the laser blocks, and emits collimated light; and
one or more output devices that receive the collimated light emitted from the collimating lens, and output signals corresponding to intensities of the individual beams of collimated light;
wherein the one or more output devices each comprise a photodetector area, the photodetector area being disposed facing a direction of the collimating lens on a line which is parallel to a layout direction of the plurality of laser elements and which orthogonally intersects with an optical axis of the collimating lens, the photodetector area also being disposed at a position that receives a portion of collimated light for all the individual beams of collimated light which are emitted.

2. The laser module according to claim 1, wherein the one or more output devices receive a portion of collimated light for all the individual beams of collimated light which are emitted by being disposed at positions separated from a central axis of the individual beams of collimated light.

3. The laser module according to claim 2, wherein at least two output devices are provided.

4. The laser module according to claim 3, wherein a pair of the output devices that includes two of the output devices is disposed at positions parallel to a layout direction of the laser elements, and in addition, is disposed at positions such that all propagation paths of the collimated light emitted from the collimating lens lie between the two output devices.

5. The laser module according to claim 4, wherein the respective output devices constituting the pair of output devices are disposed at equally spaced intervals from each other with the optical axis of the collimating lens as the midpoint.

6. The laser module according to claim 5, wherein the collimating lens collimates the plurality of beams of laser light to emit collimated light with a Gaussian intensity distribution, and the respective output devices including the pair of output devices are disposed on a line that orthogonally intersects the optical axis of the collimating lens, and are separated from each other by a distance equal to or greater than three times the shortest distance from a position on the Gaussian distribution where intensity is $1/e^2$ times a maximum intensity at the central axis of the collimated light, to the central axis.

7. The laser module according to claim 6, wherein the respective output devices including the pair of output devices are disposed separated from each other by a distance less than or equal to six times the shortest distance.

8. The laser module according to claim 4, wherein the collimating lens emits the collimated light such that all of the propagation paths of the collimated light intersect at one location, and the respective output devices including the pair of output devices are disposed such that the one location lies between the two output devices.

9. The laser module according to claim 4, wherein at least one output device is provided in addition to the pair of output devices, and the at least one output device other than the pair of output devices is disposed on a line which is perpendicular to the layout direction of the laser elements and which orthogonally intersects the optical axis of the collimating lens.

10. The laser module according to claim 1, further comprising:
- a filter, disposed at a position obstructing all propagation paths of the collimated light emitted from the collimating lens, that transmits the plurality of beams of laser light in the collimated light at a transmittance according to the wavelength of the collimated light; and
- an intensity detector that detects collimated light transmitted by the filter, and outputs signals corresponding to the intensities of the individual beams of laser light in the collimated light thus transmitted.

\* \* \* \* \*